(12) United States Patent
Sanders et al.

(10) Patent No.: US 6,218,905 B1
(45) Date of Patent: Apr. 17, 2001

(54) COMMON-GATE TRANSIMPEDANCE AMPLIFIER WITH DYNAMICALLY CONTROLLED INPUT IMPEDANCE

(75) Inventors: Jeffrey W. Sanders; William W. Leake, both of Colorado Springs, CO (US)

(73) Assignee: Vitesse Semiconductor, Camarillo, CA (US)

( * ) Notice: Subject to any disclaimer, the term of this patent is extended or adjusted under 35 U.S.C. 154(b) by 0 days.

(21) Appl. No.: 09/246,268

(22) Filed: Feb. 8, 1999

Related U.S. Application Data
(60) Provisional application No. 60/110,419, filed on Nov. 30, 1998.

(51) Int. Cl.[7] .................................................. H03F 3/08
(52) U.S. Cl. ........................................ 330/308; 250/214 A
(58) Field of Search ............................ 330/85, 110, 308; 250/214 A, 214 AG; 359/189

(56) References Cited

U.S. PATENT DOCUMENTS

| | | | |
|---|---|---|---|
| 5,812,030 | * | 9/1998 | Inami et al. ........................ 330/308 |
| 5,900,779 | * | 5/1999 | Giacomini ........................... 330/252 |
| 5,929,434 | * | 7/1999 | Kozlowski et al. ............. 250/214 A |
| 6,037,841 | * | 3/2000 | Tanji et al. ........................... 330/308 |

* cited by examiner

Primary Examiner—Robert Pascal
Assistant Examiner—Khanh Van Nguyen
(74) Attorney, Agent, or Firm—Christie, Parker & Hale, LLP

(57) ABSTRACT

A transimpedance amplifier is configured for high gain, high bandwidth, low noise and stable operation. The transimpedance amplifier includes an amplifier with an output coupled to a load for setting the gain of the amplifier. The input of the amplifier serves as the input to the transimpedance amplifier and is substantially isolated from the load. The input impedance of the transimpedance amplifier is controlled as a function of the applied input signal. Preferably, the amplifier is a field effect transistor (FET). A feedback amplifier is used to control the input impedance. Automatic gain control is used to keep the amplifier out of saturation.

26 Claims, 4 Drawing Sheets

COMMON-GATE TRANSIMPEDANCE AMPLIFIER WITH DYNAMICALLY CONTROLLED INPUT IMPEDANCE

This application claims benefit of provisional Application 60/110,419 filed Nov. 30, 1998.

BACKGROUND OF THE INVENTION

The present invention relates generally to the field of amplifiers, and in particular, to transimpedance amplifiers for generating output characteristics having high bandwidth, high gain, low noise and stable operation by controlling the input impedance of the transimpedance amplifier.

Receivers in optical communication systems often use photodetectors to detect incoming optical signals. Photodetectors generate a current based on received optical energy. The current generated by the photodetector is then generally converted to a voltage using a transimpedance amplifier, namely an amplifier whose output voltage is dependent on its input current. In most commercial applications, the transimpedance amplifier operates at input currents between 1 $\mu$A to 2 mA, and produce outputs on the order of 5 mV to 500 mV. Thus, the transimpedance amplifier generally has a small signal gain on the order of 5 k$\Omega$, i.e. 5V/mA. Minimal distortion of the signal spectrum is preferred, and therefore, bandwidth must be high, by way of example, 2 GHz for SONET OC-48 applications. Moreover, a high gain transimpedance amplifier is generally used, and the transimpedance amplifier is positioned at the front end of the receiver. Accordingly, noise due to the transimpedance amplifier should be kept to a minimum, on the order of 5 pA/$\sqrt{Hz}$, in order to reduce noise propagation through the receiver. In addition, if a feedback architecture is used, stable operation of the transimpedance amplifier should be assured.

A conventional transimpedance amplifier is shown in FIG. 1. A photodetector 11 is used to convert an optical input into a current. The photodetector 11 is connected to the input of a transimpedance amplifier 13 with an open-loop gain of (A). A feedback resistor 15 is connected across the input and output of the transimpedance amplifier 13. The photodetector and the transimpedance amplifier have associated inherent capacitance. Accordingly, for analytical purposes, a shunt capacitor 17 representing the sum of the photodetector capacitance, the input capacitance of the transimpedance amplifier 13 and the parasitic capacitances is shown.

In operation, an optical signal entering the photodetector 11 is converted into a current $I_{IN}$. Due to the high input impedance of the amplifier, the current $I_{IN}$, for all intents and purposes, also flows through the feedback resistor. Thus, a voltage, $V_{OUT}$, is developed at the output of the transimpedance amplifier 13 due to the flow of current $I_{IN}$ in the feedback resistor 15. Analysis of the closed loop system in the frequency domain yields Equation 1 for the transfer function from $I_{IN}$ to $V_{OUT}$.

$$\frac{V_{out}}{I_{in}} = -\frac{R_F}{1 + j\omega R_F C_{in}/(1+A)} \qquad \text{Equation 1.}$$

From the transfer function of Equation 1, it can be seen that the dominant pole, $(A+1)/(R_F C_{IN})$, is set by the value of resistance $R_F$ of the feedback resistor 15, the input capacitance $C_{IN}$, and the open-loop gain of the transimpedance amplifier 13 (A). For large open-loop gains, i.e., large values of (A), the dominant pole, and therefore, the corner frequency at which signal attenuation can be expected, is approximated by $A/(R_F C_{IN})$. Thus, from Equation 1, high closed-loop gain can be achieved by selecting a large value of resistance $R_F$ for the feedback resistor 15. However, for large values of $R_F$, the amplifier gain (A) must also be high so that dominant pole can be maintained at a relatively high frequency so that high bandwidth may be achieved as well.

These constraints, however, can result in stability problems because the separation in frequency of the dominant pole from the pole of the amplier is reduced. Generally speaking, a closed-loop system is stable if the magnitude of the loop gain is less than unity when the phase shift is 180°. Initially, the gain begins to roll-off at the dominant pole, and a 45° phase shift is seen at the roll-off frequency. The phase shift continues to increase from the dominant pole as a function of frequency at a rate of 45°/decade. A further increase in gain roll-off is seen at the pole of the amplifier, and an additional 45° of phase shift is added into the loop. The phase shift continues to increase from the pole of the amplifier as a function of frequency at a rate of 90°/decade. Set against this background, it can be seen that, for stability purposes, the poles should be sufficiently spread in frequency such that an increase in phase shift due to the dominant pole in conjunction with an increase in phase shift due the pole of the amplifier is such that at unity gain the phase shift of the loop is less than 180°.

Another important consideration is noise. Noise tends to be inversely proportional to the value of the feedback resistor 15 and is given by the expression in Equation 2, wherein T is the absolute temperature in degrees Kelvin, k is Boltzmann's constant, and $\Delta f$ is the change in frequency.

$$\text{Noise} = \langle i^2 r \rangle = \frac{4kT}{R_F} \Delta f \qquad \text{Equation 2.}$$

Accordingly, the noise can also be reduced by increasing the resistance value $R_F$ of the feedback resistor. However, as discussed above, for large values of resistance, the open-loop gain (A) of the transimpedance amplifier 13 must be increased proportionately to maintain sufficient bandwidth.

Conventional amplifiers, however, generally have a fixed gain-bandwidth product. Accordingly, increasing the open loop-gain (A) of the transimpedance amplifier 13 decreases the open-loop bandwidth of the transimpedance amplifier 13. In turn, this causes the pole of the transimpedance amplifier 13 to move toward the dominant pole of the closed-loop system. Accordingly, increasing both $R_F$ and the open loop gain reduces the phase margin, possibly resulting in instability. For low frequency applications where the gain-bandwidth product of the transimpedance amplifier 13 is well in excess of the desired system bandwidth, the approach of increasing both $R_F$ and the open loop gain works quite well. However, for high frequency applications, the phase margin problem can become catastrophic, and the solution of lowering the closed-loop gain increases the noise, or alternatively, if the closed-loop gain is not reduced, decreases the bandwidth. This may not always be possible for a given application. Therefore, there is a current need for a transimpedance amplifier with high bandwidth, high gain, low noise and stable operation.

SUMMARY OF THE INVENTION

An embodiment of the present invention is directed to a transimpedance amplifier which satisfies this need. In one embodiment, a transimpedance amplifier includes an amplifier with an output coupled to a load. The load sets the gain of the transimpedance amplifier. The input of the amplifier is substantially isolated from the load and serves as the input for the transimpedance amplifier. A feedback circuit, such as a feedback amplifier, is used to control the input impedance of the transimpedance amplifier as a function of the input signal. Preferably, the amplifier is a field effect transistor (FET) In this embodiment, the input of the feedback circuit is connected to the source of the FET, and the output of the feedback circuit is connected to the drain of the FET.

In another embodiment, an automatic gain control (AGC) circuit is employed to keep the FET amplifier out of saturation. The AGC circuit includes an isolation FET connected between the load the drain of the FET. A low pass filter is connected to the load. The output of the low pass filter is connected to an AGC amplifier. The output of the AGC amplifier is connected to the gate of an AGC FET. The output of the AGC FET is coupled to the drain of the FET.

The transimpedance amplifier has numerous applications. By way of example, the transimpedance amplifier can be utilized in an optical receiver. In one embodiment, the optical receiver includes a photodetector at the input for converting an optical signal into a current signal. The current signal from the photodetector is coupled to the input of the transimpedance amplifier.

It is understood that other embodiments of the present invention will become readily apparent to those skilled in the art from the following detailed description, wherein it is shown and described only embodiments of the invention by way of illustration of the best modes contemplated for carrying out the invention. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

Figure 2:
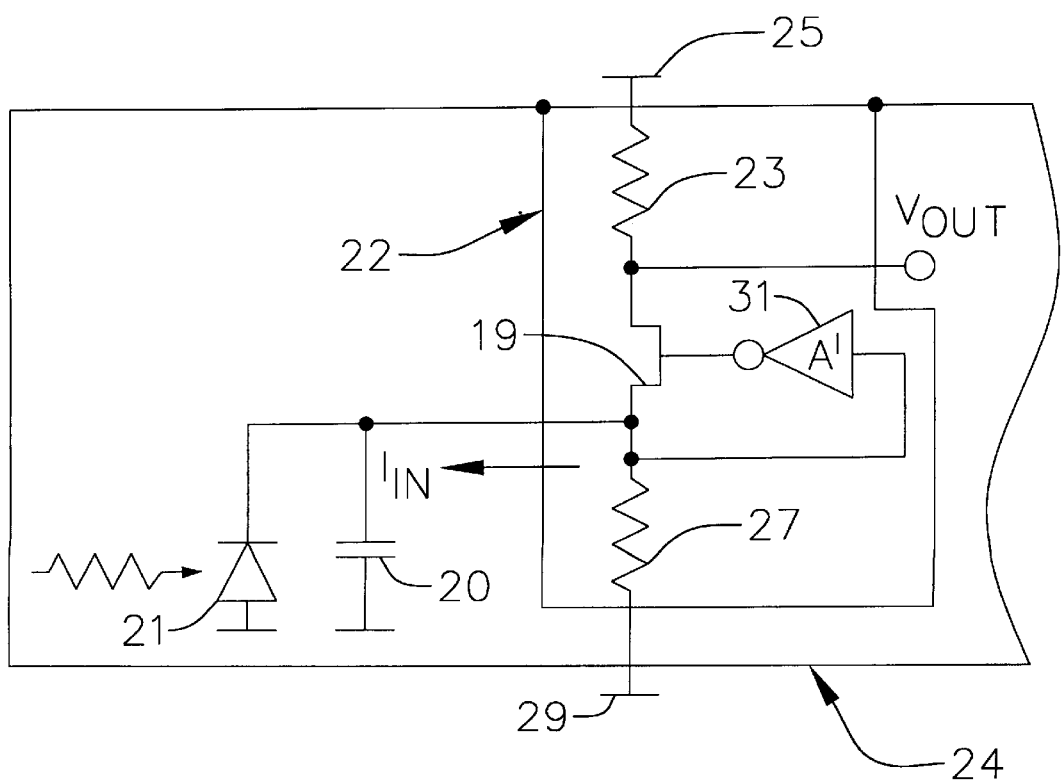
FIG. 2 is an electrical schematic block diagram of a transimpedance amplifier in accordance with a preferred embodiment of the present invention.

According to one embodiment of the present invention, high bandwidth, high gain, low noise and stable operation for a transimpedance amplifier are achieved with the arrangement shown in FIG. 2. In the described embodiment, a photodetector 21 and a transimpedance amplifier 22 are positioned at the front end of an optical receiver 24. The photodetector 21 is used to convert an optical input signal into a current. The photodetector 21 is connected to the input node of a transimpedance amplifier 22 at the source of a common-gate field-effect transistor (FET) 19. A capacitor 20 representing the sum of the photodetector capacitance, the input capacitance to the transimpedance amplifier 22, and the parasitic capacitances is shown in shunt with the photodetector 21. A load resistor 23, connected between the drain of the FET 19 and the upper rail of a power supply 25, is used to convert the input current $I_{IN}$ to a voltage $V_{OUT}$. An input resistor 27, connected between the source of the FET 19 and the negative rail of the power supply 29, maintains a bias current through the common-gate FET 19 and biases the input voltage of the transimpedance amplifier 22. Alternatively, the input resistor 27 could be a FET or any other current source. A feedback amplifier 31, connected between the source and gate of the FET 19, modulates the gate voltage to control the input impedance of the transimpedance amplifier 22.

An attractive feature of the described embodiment is that the input impedance of the transimpedance amplifier 22 is kept low by the common-gate FET. This means that the pole at the input of the transimpedance amplifier 22, approximated by $1/(R_{IN}C_{IN})$, can be maintained at a relatively high frequency since it varies inversely with input impedance. The gain of the transimpedance amplifier 22, on the other hand, is set by the load resistor 23 independent of the pole at the input of the transimpedance amplifier 22. Accordingly, high gain can be achieved by selecting a large value of resistance $R_L$ for the load resistor 23 without affecting the pole at the input of the transimpedance amplifier 22.

The output of the transimpedance amplifier 22 also has a pole which affects the overall frequency response. The pole at the output of the transimpedance amplifier 22 is approximated by $1/(R_L C_{OUT})$, where $C_{OUT}$ is the parasitic capacitance (not shown) at the output of the transimpedance amplifier 22. However, the parasitic capacitance at the output of the transimpedance amplifier 22 is much less than the input capacitance $C_{IN}$ because the input capacitance is dominated by the capacitance of the photodetector 21, which is typically 0.5 pF. Thus, due to the low parasitic output capacitance, the value of resistance $R_L$ of the load resistor 23 can be large without significantly affecting the pole at the output of the transimpedance amplifier 22 resulting in optimal bandwidth performance with high gain.

To best illustrate the performance characteristics of the described embodiment, the transimpedance amplifier 22 will first be considered without the feedback amplifier 31. That is, for the purposes of analyzing the performance of the transimpedance amplifier 22, assume initially that the gate of the common-gate FET 19 is connected to a fixed voltage reference. With this arrangement, the input impedance $R_{IN}$ of the transimpedance amplifier 22 is substantially equivalent to $1/g_m$ in parallel with the input resistor 27, where $g_m$ is the transconductance of the common-gate FET 19.

The transconductance $g_m$ of the common-gate FET 19 with a fixed voltage reference applied to the gate is given by Equation 3, wherein β is the transistor parameter beta, W is a channel width of the transistor, L is a channel length of the transistor, $V_T$ is the threshold voltage of the transistor, and I is the current through the transistor.

$$g_m = \beta \frac{W}{L}(V_{GS} - V_T) = \sqrt{2\beta \frac{W}{L} I} \qquad \text{Equation 3.}$$

From Equation 3, it can be seen that the transconductance $g_m$ varies with the width of the common-gate FET 19 and current through the device set by the input resistor 27.

The noise in the common-gate FET with the gate connected to a fixed voltage reference is given by Equation 4.

$$\text{Noise} = \langle i^2 d \rangle = 4kT \cdot \frac{2}{3} g_m \Delta f = 4kT \cdot \frac{2}{3} \Delta f \sqrt{2\beta\left(\frac{W}{L}\right)I} \quad \text{Equation 4.}$$

From Equations 3 and 4, it can be seen that both increased width and increased current, necessary for low input impedance to maintain high bandwidth, result in increased noise. In addition, since the input current is set by input resistor 27, the noise contributed by the input resistor 27 will also be high if a large bias current is used.

To solve this problem, a feedback amplifier 31 is used to control the input impedance of the transimpedance amplifier 22. With the feedback amplifier 31, the input impedance $R_{IN}$ is approximated by $1/g_m(1+A)$, where (A) is the gain of the feedback amplifier 31. This means that a low input impedance $R_{IN}$, necessary for achieving high bandwidth performance, can be maintained by increasing the gain (A) of the feedback amplifier 31 without reducing the transconductance of the common-gate FET 19. Accordingly, the width of the common-gate FET 19 and the bias current can be kept small without increasing the input impedance of the transimpedance amplifier 22. As a result, the noise can be kept low while still achieving high bandwidth.

Figure 1:
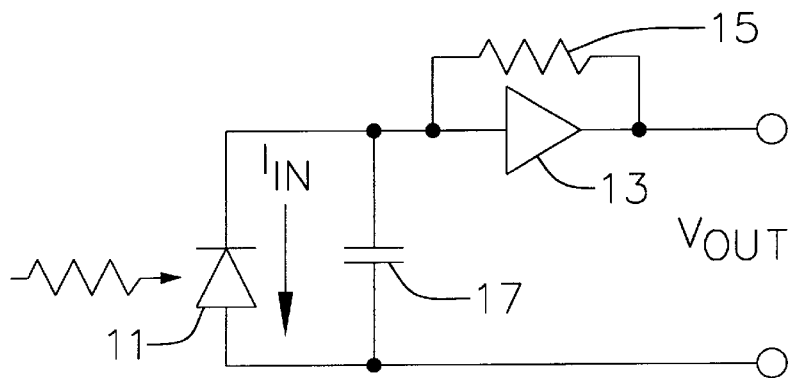
FIG. 1 is an electrical schematic block diagram of a conventional transimpedance amplifier.

The transimpedance amplifier 22 of the described embodiment does not suffer from the instability problems associated with conventional transimpedance amplifiers. The feedback loop of this design is much smaller than the conventional approach described with reference to FIG. 1, and the necessary gain is much smaller, by way of example, 6 compared to 40. Without the stability constraint, the gain of the transimpedance amplifier can be set as high as desired by increasing the size of the load resistor 23 until the pole determined by load resistor 23 and the parasitic capacitance (not shown) on the output of the drain of the FET 19 restrict the bandwidth. This parasitic capacitance can generally be kept much lower than the 0.5 pF capacitance generally encountered with conventional closed-loop approaches.

Figure 3:
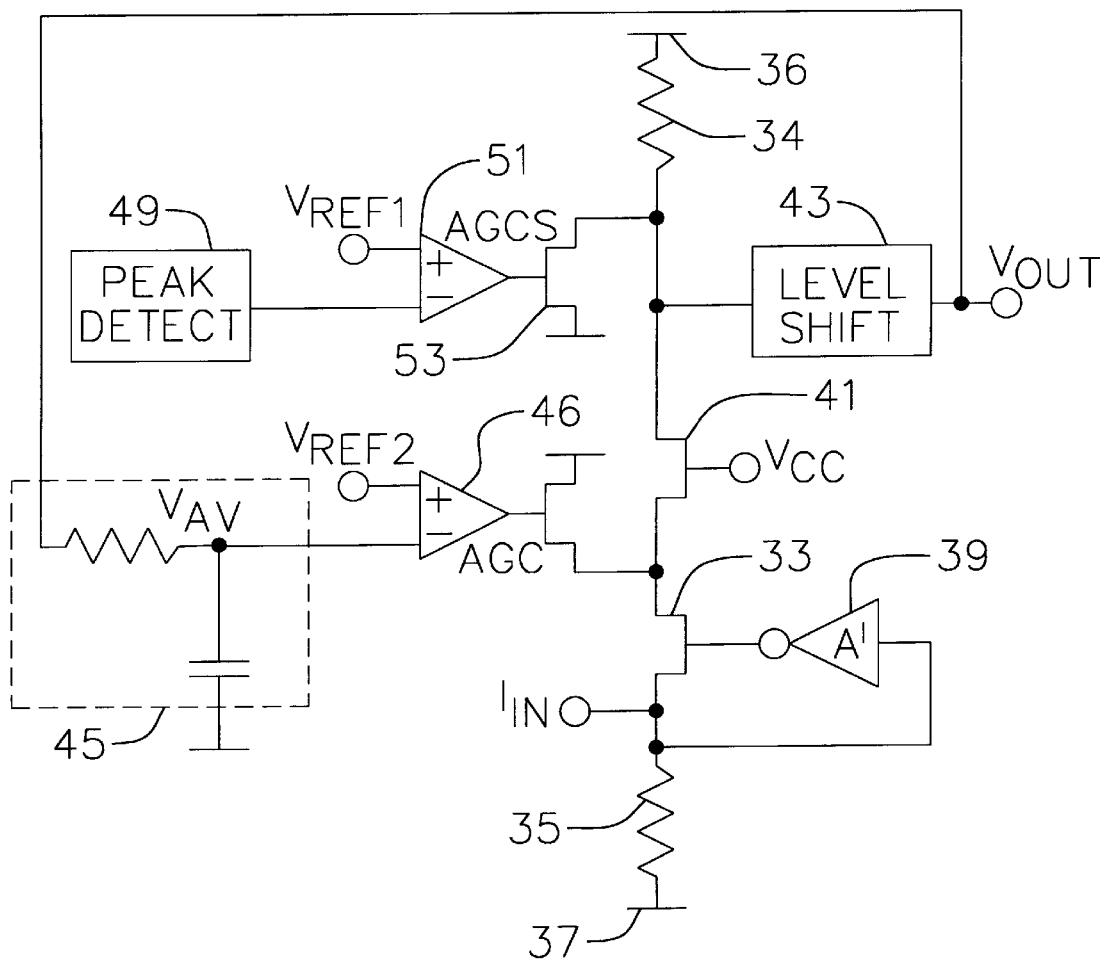
FIG. 3 is an electrical schematic block diagram of a transimpedance amplifier with AGC in accordance with a preferred embodiment of the present invention.

FIG. 3 illustrates a semi-schematic, semi-block diagram of an embodiment of a transimpedance amplifier with AGC. Due to the high dynamic range of the input current $I_{IN}$, an AGC circuit is desirable to limit the output voltage $V_{OUT}$ and keep the transimpedance amplifier out of saturation. The transimpedance amplifier utilizes a common-gate FET 33 as an amplifier with the source of the FET 33 serving as the input node for the current $I_{IN}$ from a photodetector (not shown). A load resistor 34 is connected between the positive rail of a power supply 36 and, via isolation FET 41, the drain of the FET 33. The load resistor is used to convert the input current $I_{IN}$ to a voltage. An input resistor 35 is connected between the source of the FET 33 and the negative rail of the power supply 37 to maintain a bias current through the common-gate FET 33. A feedback amplifier 39 provides a feedback path from the source of the FET 33 to the gate of the FET 33. The feedback loop modulates the gate voltage as a function of the frequency of the input current $I_{IN}$ to control the input impedance of the transimpedance amplifier.

The AGC circuit consists of two separate AGC loops. The first loop acts to servo the average output voltage of the transimpedance amplifier to a reference voltage, and the second loop serves to maintain the peak value of the output voltage of the transimpedance amplifier. A level shifter 43 is connected to the load resistor 34 to isolate the output of the transimpedance amplifier and the AGC circuit. The output of the level shifter 43 is used to drive both AGC loops.

The first AGC loop utilizes a low-pass filter 45 at the output of the level shifter 43 to generate the AGC voltage $V_{AGC}$. The AGC voltage is the average output voltage of the transimpedance amplifier. The AGC voltage is fed to an AGC amplifier 46 where it is compared with a DC reference voltage $V_{REF2}$ at a second input to the AGC amplifier 46, in the described embodiment 1.5 volts below the voltage on the positive rail. The first AGC loop acts to servo the voltage drop across the load resistor 34 to the reference voltage $V_{REF2}$. The output of the AGC amplifier 46 is used to drive an AGC FET 48 which is source coupled to the drain of the FET 33 in the transimpedance amplifier.

Under small signal conditions, the AGC voltage will be greater than the reference voltage $V_{REF2}$ thereby forcing the output of the AGC amplifier 46 low and turning off the AGC FET 48. As a result, all the input current $I_{IN}$ will flow through the isolation FET 41. As the input current $I_{IN}$ increases causing the AGC voltage $V_{AGC}$ to approach the reference voltage $V_{REF2}$, the AGC FET 48 will begin conducting, shunting current away from the isolation FET 41.

An undesirable result of the first AGC loop is that the DC bias current from the input resistor 35 will also be shunted, raising the DC bias of the output voltage $V_{OUT}$. As a result, the minimum signal voltage at the output (at the load resistor 34) will drop to a level that could cause the isolation FET 41 to fall out of saturation, creating distortion and possible performance degradation.

The second AGC loop is added to maintain the peak signal at the output (at the load resistor 34). The second AGC loop employs a peak detector 49 connected to the output of the level shifter 43. The peak voltage at the output of the peak detector 49 is compared to a reference voltage $V_{REF1}$, in the described embodiment 1.0 volt below the voltage on the positive rail, by a comparator 51. The output of the comparator 51 is used to drive a FET 53 into saturation. The FET 53 provides a DC current source which adds back the necessary bias to the load resistor that the AGC FET 48 in the first AGC loop took away.

Figure 4:
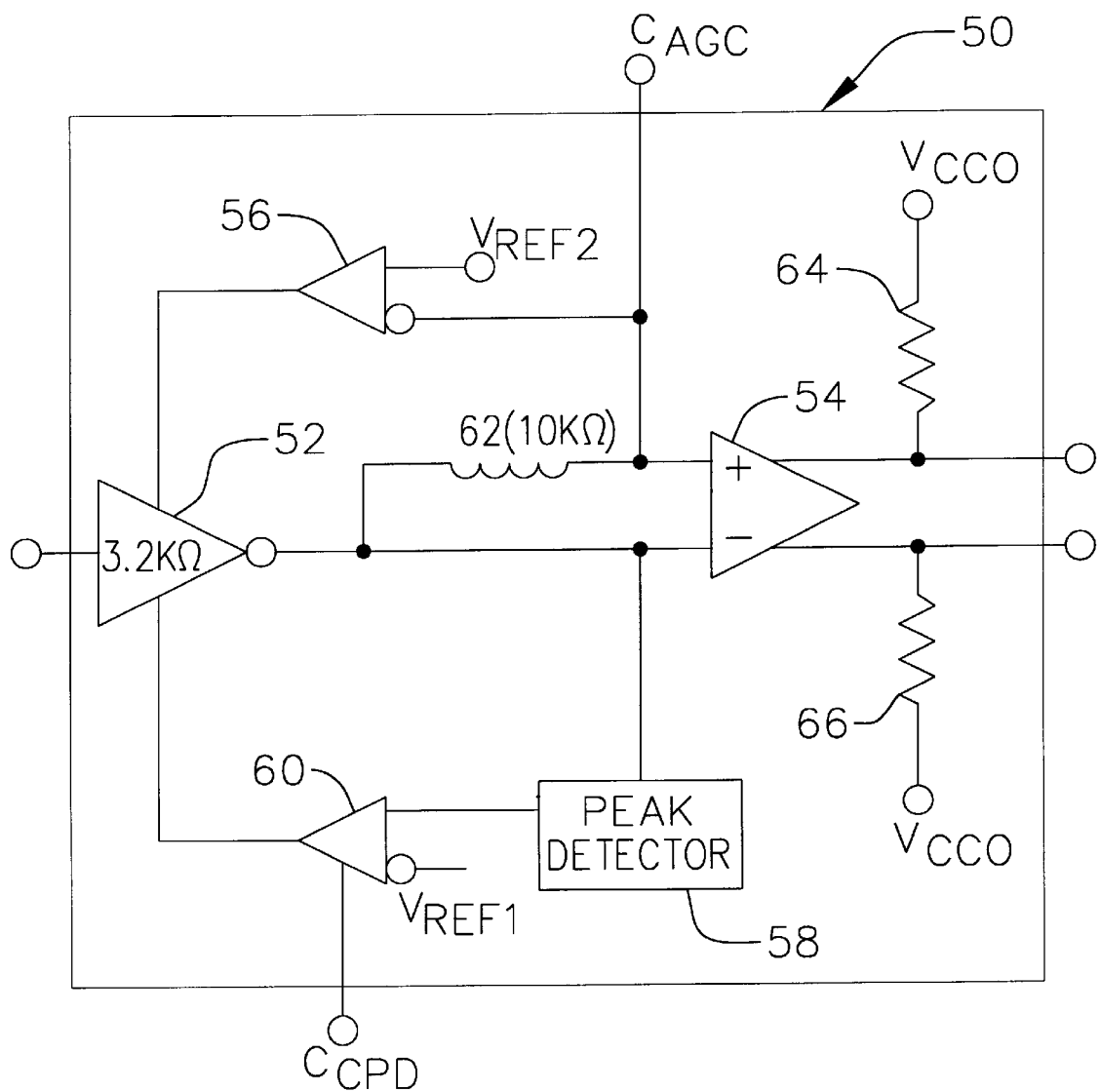
FIG. 4 is an electrical schematic block diagram of a transimpedance amplifier with AGC incorporated into an integrated circuit in accordance with a preferred embodiment of the present invention.

An integrated circuit incorporating an embodiment of the transimpedance amplifier with AGC is shown in FIG. 4. The exemplary integrated circuit 50 is a gallium arsenide transimpedance amplifier for use in a lightwave receiver system. The integrated circuit 50 operates at a data rate of 2.488 Gb/s and has a wide dynamic range capable of amplifying input currents over a range of 1 μA to 4 mA while keeping noise to a minimum, approximately 8.5 pA/√Hz. The transimpedance amplifier 52 is designed with high gain, on the order of 3.2 kΩ.

Two AGC loops are used to limit the gain of the transimpedance amplifier 52 under large signal inputs. The first AGC loop uses an AGC amplifier 56 in conjunction with an off-chip averaging capacitor (not shown) connected to terminal $C_{AGC}$. The second AGC loop includes a peak detector 58 in series with a comparator 60. The comparator utilizes an external compensation capacitor (not shown)connected to terminal $C_{CPD}$.

The output of the transimpedance amplifier 52 is connected to a differential output buffer 54 for converting the single-ended output of the transimpedance amplifier 52 into a differential output. The output of the transimpedance amplifier 52 is fed into the negative input of the differential output buffer 54 and the average output voltage appearing at the connection between resistor 62 and the off-chip averaging capacitor $C_{AGC}$ is fed to the positive input. The differential outputs of the buffer 54 are preferably open-drain FETs (not shown) each with a 50Ω external load resistor 64, 66 to set the output impedance of the integrated circuit.

Figure 5:
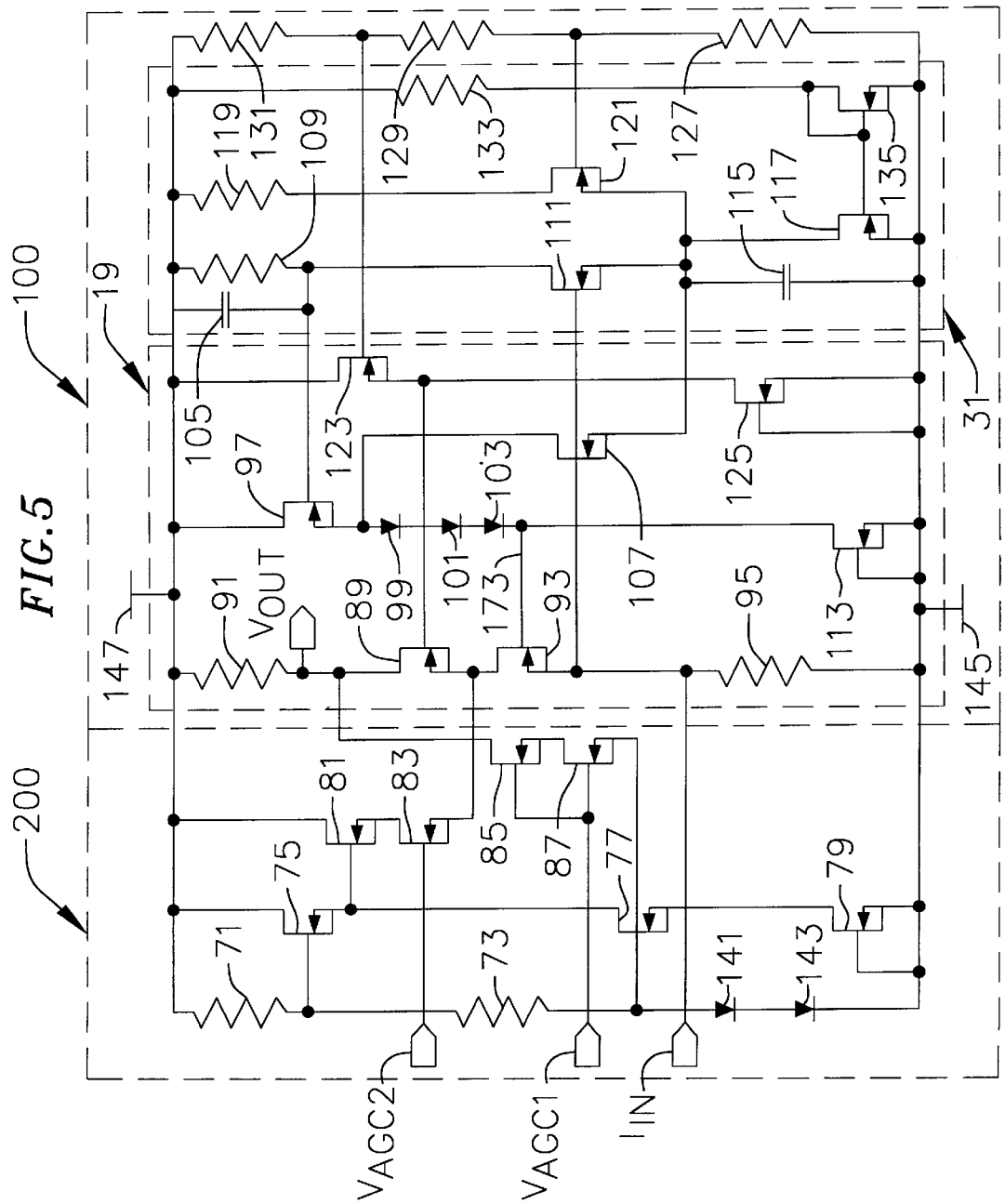
FIG. 5 is a detailed electrical schematic of a transimpedance amplifier with AGC in accordance with a preferred embodiment of the present invention.

FIG. 5 illustrates a detailed schematic of one embodiment of the transimpedance amplifier 100. Also shown is the output portion of the AGC loops 200 and how they interface with the transimpedance amplifier 100. In the described embodiment, the amplifier 19 is constructed with a common-gate FET 93 operated in series with a FET 89 in a cascode arrangement. The cascode FET 89 is used to increase the output impedance of the amplifier 19. The source of the common-gate FET 93 serves as the input node for the current $I_{IN}$ from the photodetector (not shown). A resistor 91 is the load resistor and is used to convert the input current $I_{IN}$ to a voltage $V_{OUT}$. A resistor 95 serves as the input resistor and operates to maintain a bias current through the amplifier 19. The input node of the transimpedance amplifier 100 at the source of the common-gate FET 93 is connected to the input of the feedback amplifier 31. The feedback amplifier 31 senses the phase of the input current $I_{IN}$ and modulates the gate voltage of the common-gate FET 93, dynamically changing the input impedance of the transimpedance amplifier 100 as a function of frequency.

A DC bias voltage is set at the input of the transimpedance amplifier 100 with a differential amplifier at the input of the feedback amplifier 31. The differential amplifier comprises FETs 111 and FET 121, with FET 117 used as a constant current source. The constant current source is obtained by using the FET 117 in conjunction with FET 135 to establish a current mirror, the DC current being set by a reference resistor 133. With this arrangement, the DC bias voltage at the input of the transimpedance amplifier 100 is forced to the voltage at the gate of the FET 121 from a resistor divider network formed by resistors 127, 129 and 131. The DC bias voltage establishes the DC voltage across the photodetector (not shown) with respect to the lower rail of the power supply 145. Preferably, the DC bias voltage is approximately 2 volts. The resistor divider network also serves to bias the gate of the cascode FET 89 in the amplifier 19. Specifically, the bias voltage established by the resistor divider network is coupled to the gate of the FET 89 through a FET 123 configured as a source follower. FET 125 is a constant current source that biases the source follower FET 123.

To best understand the operation of the transimpedance amplifier 100, the effect of the AGC portion 200 will be ignored. The photodetector (not shown) provides a source for the signal current drawn from the transimpedance amplifier 100. The signal current flows through the load resistor 91 through the cascoded arrangement of the amplifier 19 and out the input node of the transimpedance amplifier. As a result, the signal voltage $V_{OUT}$ appearing at the output of the transimpedance amplifier 100 is set by the load resistor 91. Thus, the transimpedance of the amplifier 100 is essentially determined by the load resistor 91.

The input node of the transimpedance amplifier 100 at the source of the common-gate FET 93 is connected to the differential input of the feedback amplifier 31. The differential input FETs 111 and 121 act as a common-source amplifier for the signal voltage appearing at the input node of the transimpedance amplifier 100. A capacitor 115 is used to reduce the AC impedance across the constant current source FET 117, thereby increasing the gain of the feedback amplifier 31. Preferably, the capacitor 115 is 15 pF. As the signal current drawn out of the transimpedance amplifier 100 increases, the signal voltage at the input node of the transimpedance amplifier 100 is reduced due to the increased current flow through the load resistor 91. As a result, the amplified signal voltage appearing at the drain of the FET 111 increases. The increased amplified signal voltage is applied to the gate of a source-follower FET 97, causing the source voltage to increase. The source-follower FET 97 being biased by a constant current source FET 113. The source voltage of the source-follower FET 97 is applied to the gate of the common-gate FET 93 through a level shifter consisting of series diodes 99, 101 and 103. The increase in gate voltage of the common-gate FET 93 resulting from the decrease in source voltage causes the gate-to-source voltage $V_{GS}$ to increase. With increased $V_{GS}$ comes increased signal current flow through the common-gate FET 93, thereby reducing the input impedance looking into the source of the common-gate FET 93 (the input impedance of the amplifier 19).

Conversely, as the current drawn out of the transimpedance amplifier 100 is reduced, the increased signal voltage at the source of the common-gate FET 93 is applied to the input of the feedback amplifier 31. As a result, the reduced amplified signal voltage at the output of the differential amplifier is coupled to the gate of the common-gate FET, via the source-follower FET 97 and the level shifter, causing a corresponding reduction in gate-to source voltage $V_{GS}$ reducing the current flow through the common-gate FET 93 and increasing the input impedance of the amplifier 19.

A FET 107 is used to increase the speed of the feedback amplifier 31 by increasing the current flowing through the source-follower FET 97 as the signal voltage at the input node increases. The diodes, 99, 101, and 103 ensures that the drain-to-gate voltage of the FET 107 is maintained higher than the gate-to-source voltage of the common-gate FET 93 thereby maintaining the FET 107 in saturation.

A capacitor 105 is used to control a pair of complex conjugate poles that is formed by the pull-up resistors 109 and 119 of the differential amplifier. The capacitor 105 is used to split the conjugate pair of poles apart which effectively increases the bandwidth through the transimpedance amplifier 100. The capacitor 105 is small compared to the capacitance of the photodetector, and is preferably femto farads.

As described above, an AGC circuit maintains the dynamic range of the transimpedance amplifier 100 for large current swings at the input. The AGC circuit comprises two separate AGC loops. The first loop acts to servo the voltage drop across the load resistor 91 to a reference voltage, and the second loop acts to maintain the peak signal across the load resistor 91. The detailed schematic of FIG. 5 shows the interface between the transimpedance amplifier 100 and the output portion of the two AGC loops 200.

The first AGC loop is controlled by the AGC voltage (the average output voltage of the transimpedance amplifier). The AGC voltage $V_{AGC1}$ is applied to the gate of FET 83, via the AGC amplifier (not shown) which, in turn, shunts current away from the load resistor 91 when the AGC voltage exceeds a reference voltage ($V_{REF2}$ in FIG. 3). FET 81 is a cascode transistor which maintains the drain voltage of the FET 83 approximately equal to the drain voltage of the FET 89 resulting in improved matching of the two FETs reducing distortion that arises from the non-linear response of the input impedance ratio of the FET 83 to the FET 89 under varying input current conditions. By way of example, it is not unusual to have 10–20% total harmonic distortion in the output voltage of the transimpedance amplifier under full input current conditions. FETs 75, 77 and 79 provide a source-follower bias network for the FET 81.

As described above with reference to FIG. 3, an undesirable result of the first AGC loop is that the bias current from the input resistor 95 will also be shunted, raising the DC bias on the output voltage $V_{OUT}$. By way of example, with an average output voltage of −1.5 volts with respect to the positive rail of the power supply 147, the output voltage $V_{OUT}$ could swing as low as −3 volts causing the FET 89 to fall out of saturation, creating distortion and possible performance degradation. The second AGC loop is added to maintain the peak signal at the output (at the load resistor 91). The second AGC loop drives additional bias current into the load resistor 91 through the cascode arrangement of FETs 85 and 87. Specifically, when the peak voltage of the output voltage of the transimpedance amplifier $V_{OUT}$ exceeds a reference voltage ($V_{REF1}$ in FIG. 3), a voltage $V_{AGC2}$ is applied to the gate of the FET 83 driving it into saturation. In the described embodiment, with a DC balanced input signal, the peak voltage at the output (at the load resistor 91) should be −1 volt with respect to the positive rail of the power supply 147. The cascode arrangement of the FETs 77 and 79 serves to minimize the capacitive loading at the output of the transimpedance amplifier $V_{OUT}$. As a result, the AGC circuit has minimum impact on the bandwidth. The FET 87 is preferably an enhancement mode device to ensure that it can be turned off. Diodes 141 and 143 provide a voltage offset to facilitate the shutoff of the FET 87 under worst case conditions.

It is apparent from the foregoing that the present invention satisfies an immediate need for a transimpedance amplifier with high bandwidth, high gain, and low noise. This transimpedance amplifier may be embodied in other specific forms and used with a variety of devices without departing from the spirit or essential attributes of the present invention. It is therefore desired that the present embodiment be considered in all respects as illustrative and not restrictive, reference being made to the appended claims rather than the foregoing description to indicate the scope of the invention.

What is claimed is:

1. A transimpedance amplifier having a signal input, comprising:
   a load;
   an amplifier having an output coupled to the load, and an input substantially isolated from the load, said input being coupled to the input of the transimpedance amplifier;
   a feedback circuit for controlling an input impedance of the transimpedance amplifier as a function of a signal applied to the signal input; and
   an automatic gain control circuit (AGC) comprising an isolation FET, an AGC amplifier, and an AGC FET, the isolation FET being disposed between the load and the amplifier, the AGC amplifier having an input coupled to the output of the amplifier and an output coupled to a gate of the AGC FET, the AGC FET having a source coupled to the amplifier and a source of the isolation FET.

2. The transimpedance amplifier of claim 1 wherein said load comprises a resistor.

3. The transimpedance amplifier of claim 1 wherein said amplifier comprises a field effect transistor (FET) including a drain coupled to the isolation FET, a source comprising the input, and a gate.

4. The transimpedance amplifier of claim 3 wherein the feedback circuit comprises a feedback amplifier having an input coupled to the source of the FET and an output coupled to the gate of the FET.

5. The transimpedance amplifier of claim 3 wherein the feedback circuit comprises an inverting feedback amplifier.

6. The transimpedance amplifier of claim 3 further comprising a low-pass filter having a first low-pass filter terminal coupled to the load and a second low-pass filter terminal forming the input of the AGC amplifier.

7. The transimpedance amplifier of claim 6 wherein the AGC circuit further comprises a peak detector having an input coupled to the load, a second AGC amplifier having an input coupled to an output of the peak detector, and a second AGC FET having a gate coupled to an output of the second AGC amplifier and a drain coupled to the load.

8. The transimpedance amplifier of claim 3 further comprising an input resistor connected to the source of the FET.

9. A transimpedance amplifier, comprising:
   a FET having a first terminal, a second terminal, and gate;
   a load resistor having one of two terminals coupled to the first terminal of the FET;
   an input resistor having one of two terminals coupled to the second terminal of the FET;
   a feedback amplifier having an input coupled to the second terminal of the FET and an output coupled to the gate of the FET; and
   an AGC circuit having an output connected to the first terminal of the FET, said amplifier output having current shunt capability, and wherein said magnitude of current shunted is a function of a voltage signal at said one of the two terminals of the load resistor.

10. The transimpedance amplifier of claim 9 wherein the first terminal comprises a drain and the second terminal comprises a source.

11. The transimpedance amplifier of claim 9 further comprising a power supply having a positive terminal coupled to the other one of the two terminals of the load resistor, and a negative terminal connected to the other one of the two terminals of the input resistor.

12. A transimpedance amplifier comprising:
   a FET having a first terminal, a second terminal, and gate;
   a load resistor having one of two terminals coupled to the first terminal of the FET;
   an input resistor having one of two terminals coupled to the second terminal of the FET;
   a feedback amplifier having an input coupled to the second terminal of the FET and an output coupled to the gate of the FET; and
   an AGC circuit having an isolation FET disposed between said one of the two terminals of the load resistor and the first terminal of the FET, a low-pass filter having a first low-pass filter terminal connected to said one of the two terminals of the load resistor, an AGC amplifier having an input coupled to a second low-pass filter terminal of the low-pass filter, and an AGC FET having a gate coupled to an output of the AGC amplifier and a terminal coupled to the first terminal of the FET.

13. The transimpedance amplifier of claim 12 wherein the AGC circuit further comprises a peak detector having an input coupled to said one of the two terminals of the load resistor and an output coupled to an input of a second AGC amplifier, and a second AGC FET having a gate connected to an output of the second AGC amplifier and a terminal connected to said one of the two terminals of the load.

14. An optical receiver, comprising:
   a photodetector for converting an optical signal into a current signal;
   a transimpedance amplifier having an input receiving the current signal from the photodetector, a load for setting a gain of the transimpedance amplifier, said load being substantially isolated from the input of the transimpedance amplifier, and a feedback circuit for controlling an input impedance of the transimpedance amplifier as a function of a signal applied to the signal input; and an automatic gain control circuit (AGC) comprising an isolation FET, an AGC amplifier, and an AGC FET, the isolation FET being disposed between the load and the amplifier, the AGC amplifier having an input coupled to the output of the amplifier and an output coupled to a gate of the AGC FET, the AGC FET having a source coupled to the amplifier and a source of the isolation FET.

15. The optical receiver of claim 14 wherein said load comprises a resistor.

16. The optical receiver of claim 14 wherein said amplifier comprises a field effect transistor (FET) including a drain comprising the output, a source comprising the input, and a gate.

17. The optical receiver of claim 16 wherein the feedback circuit comprises a feedback amplifier having an input coupled to the source of the FET and an output coupled to the gate of the FET.

18. The optical receiver of claim 16 wherein the feedback circuit comprises an inverting feedback amplifier.

19. The transimpedance amplifier of claim 16 further comprising a low-pass filter having a first terminal coupled to the load and a second terminal coupled to an input of an AGC amplifier, and an AGC FET having a gate coupled to an output of the AGC amplifier and a terminal coupled to the drain of the FET.

20. The transimpedance amplifier of claim 19 wherein the AGC circuit further comprises a peak detector having an input coupled to the load, a second AGC amplifier having an input coupled to an output of the peak detector, and a second AGC FET having a gate connected to an output of the second AGC amplifier and a terminal connected to the load.

21. The optical receiver of claim 16 further comprising an input resistor connected to the source of the FET.

22. A transimpedance amplifier having a signal input, comprising:
   a load for setting a gain of the transimpedance amplifier, said load comprising a resistor;
   an amplifier having an output coupled to the load, a signal input substantially isolated from the load, said signal input being coupled to the signal input of the transimpedance amplifier, and a control input, said amplifier comprising a FET including a drain comprising the output, a source comprising the signal input, and a gate comprising the control input;
   a feedback circuit having an input coupled to the signal input of the amplifier, and an output coupled to the control input of the of the amplifier; and
   an automatic gain circuit (AGC) comprising an isolation FET disposed between the load and the drain of the FET, a low-pass filter having an input coupled to the load and an output, an AGC amplifier having an input coupled to the output of the low-pass filter and an output, and an AGC FET having a gate coupled to the output of the AGC amplifier and a source coupled to the drain of the FET.

23. The transimpedance amplifier of claim 22 wherein the AGC circuit further comprises a peak detector having an input coupled to the load and an output, a second AGC amplifier having an input coupled to the output of the peak detector and an output, and a second AGC FET having a gate coupled to the output of the second AGC amplifier and a drain coupled to the load.

24. The transimpedance amplifier of claim 23 further comprising an input resistor connected to the source of the FET.

25. The transimpedance amplifier of claim 23 wherein the feedback circuit comprises a feedback amplifier.

26. The transimpedance amplifier of claim 23 wherein the feedback circuit comprises an inverting feedback amplifier.

* * * * *

UNITED STATES PATENT AND TRADEMARK OFFICE
CERTIFICATE OF CORRECTION

PATENT NO. : 6,218,905 B1  Page 1 of 1
DATED : April 17, 2001
INVENTOR(S) : Jeffrey W. Sanders and William W. Leake It is certified that error appears in the above-identified patent and that said Letters Patent is hereby corrected as shown below:

Column 2,
Lines 11-14, after "dominant" delete "pole, and a 45° phase shift is seen at the roll-off frequency. The phase shift continues to increase from the dominant pole as a function of frequency at a rate of 45°/decade." and insert therefor -- pole. The dominant pole also adds 90° of phase shift. --.
Line 16, after "additional" delete "45°" and insert therefor -- 90° --.
Lines 17-18, delete "The phase shift continues to increase from the pole of the amplifier as a function of frequency at a rate of 90°/decade."

Column 3,
Line 5, after "(FET)" insert a period.

Column 6,
Line 66, after "50Ω" delete "external".

Column 8,
Lines 2-3, replace "FET 113. The" with -- FET 113, the --.
Line 26, replace "ensures" with -- ensure --.
Line 49, replace "The AGC voltage $V_{AGC1}$" with -- The AGC voltage $V_{AGC2}$ --.

Column 9,
Line 11, replace "$V_{AGC2}$ is applied to the gate of the FET 83" with -- $V_{AGC1}$ is applied to the gate of the FET 87 --.
Line 16, replace "FETs 77 and 79" with -- FETs 85 and 87 --.

Signed and Sealed this

Fourteenth Day of January, 2003

JAMES E. ROGAN
*Director of the United States Patent and Trademark Office*